(12) United States Patent
Carmona Galán et al.

(10) Patent No.: US 10,811,220 B2
(45) Date of Patent: Oct. 20, 2020

(54) ELECTRON SENSOR FOR ELECTRON MICROSCOPY

(71) Applicant: CONSEJO SUPERIOR DE INVESTIGACIONES CIENTIFICAS, Madrid (ES)

(72) Inventors: Ricardo Carmona Galán, Seville (ES); Lionel Cervera Gontard, Seville (ES)

(73) Assignee: CONSEJO SUPERIOR DE INVESTIGACIONES CIENTIFICAS (CSIC), Madrid (ES)

( * ) Notice: Subject to any disclaimer, the term of this patent is extended or adjusted under 35 U.S.C. 154(b) by 10 days.

(21) Appl. No.: 16/315,037

(22) PCT Filed: Jul. 6, 2017

(86) PCT No.: PCT/ES2017/070489
§ 371 (c)(1),
(2) Date: Sep. 9, 2019

(87) PCT Pub. No.: WO2018/007669
PCT Pub. Date: Jan. 11, 2018

(65) Prior Publication Data
US 2019/0393015 A1  Dec. 26, 2019

(30) Foreign Application Priority Data
Jul. 7, 2016  (ES) .................................. 201630925

(51) Int. Cl.
*H01J 37/244* (2006.01)
*H01J 37/26* (2006.01)
(Continued)

(52) U.S. Cl.
CPC ............ *H01J 37/244* (2013.01); *H01J 37/26* (2013.01); *H01L 31/0224* (2013.01); *H01J 2237/2441* (2013.01); *H01L 31/08* (2013.01)

(58) Field of Classification Search
USPC ................................................ 250/397, 311
See application file for complete search history.

(56) References Cited

U.S. PATENT DOCUMENTS

| | | | | |
|---|---|---|---|---|
| 7,049,585 | B2* | 5/2006 | Nakasuji | G01N 23/225 250/306 |
| 7,057,213 | B2* | 6/2006 | McFarland | G01N 27/129 257/109 |
| 2013/0032713 | A1 | 2/2013 | Barbi et al. | |

FOREIGN PATENT DOCUMENTS

| | | |
|---|---|---|
| EP | 2544026 A1 | 1/2013 |
| JP | H08162060 A | 6/1996 |

(Continued)

OTHER PUBLICATIONS

Gontard; "Detecting single-electron events in TEM using low-cost electronics and a silicon strip sensor"; Microscopy; 2014; p. 119-130; vol. 63, No. 2; Advance Access Publication.

(Continued)

*Primary Examiner* — Kiet T Nguyen
(74) *Attorney, Agent, or Firm* — Hayes Soloway PC (57) ABSTRACT

An electron sensor and a system with a plurality of electron sensors for electron microscopy using an electron microscope. More specifically, the electron microscope generates an electron beam that includes at least one electron that impacts on a lateral reception surface of said electron sensor and this generates an electrical charge of electron-hole (e-h) pairs that are detected and/or measured by at least electrodes linked to an electric circuit unit to form a high dynamic range image and measure the energy of the electrons impacting each pixel of the image.

20 Claims, 6 Drawing Sheets

(51) Int. Cl.
*H01L 31/0224* (2006.01)
*H01L 31/08* (2006.01)

(56) References Cited

FOREIGN PATENT DOCUMENTS

| JP | 2005044676 A | 2/2005 |
|----|--------------|--------|
| WO | 2005117145 A1 | 12/2005 |

OTHER PUBLICATIONS

Faruqi; "Electronic detectors for electron microscopy"; Biophysical methods; 2007; p. 549-555; 17; Elsevier.

* cited by examiner

ELECTRON SENSOR FOR ELECTRON MICROSCOPY

OBJECT OF THE INVENTION

The object of the present invention is an electron sensor for electron microscopy, and a system with a plurality of electron sensors for electron microscopy.

Therefore, the present invention can be framed in the field of sensors to detect electrons used in transmission electron microscopes (TEM), in scanning electron microscopes (SEM) or in scanning transmission electron microscopes (STEM).

BACKGROUND OF THE INVENTION

Currently, different applications in the field of electron microscopy detect and accumulate electrons to generate images, or energy spectrums. These images, or spectrums, are used in the study of materials in science and technology.

Specifically, these applications are based on the irradiation of a sample, with electrons accelerated at energies between 2 keV and 400 keV. Although less frequent, there are also TEM electron microscopes that operate with electrons accelerated at high energies of up to 1.2 MeV.

More specifically, in transmission electron microscopes (TEM), these accelerated electrons traverse the material that forms a sample, and by means of magnetic lenses, enlarged two-dimensional images are generated of the sample and diffraction patterns (two-dimensional images). Therefore, in TEM electron energy-loss spectroscopy applications (EELS or EFTEM), an energy filter is used that is manufactured with electromagnetic lenses, whereby an energy spectrum is obtained (one-dimensional image), or an energy-filtered image (two-dimensional image) with information about the chemical composition of the sample.

With the aim of obtaining the images, electron microscopes comprise electron sensors that are manufactured with "pixelated" semiconductors. In other words, semiconductors that on the surface where photons, or electrons, impact comprise a plurality of discrete electronic components. These discrete electronic components are organized by way of a one-dimensional or two-dimensional matrix, to detect the photons, or electrons, wherein each discrete electronic component is usually called "pixel". In this way, the "pixelated" semiconductors detect, by means of each "pixel", the position of impact of an electron, or a photon, in one or two spatial dimensions.

Specifically, the "pixelated" electron sensors used in TEM are manufactured with CCD, or CMOS-type technology. Particularly, CCD sensors include in each "pixel" a sensor part whereon the electrons impact and another electronic circuit part. Whilst, in the CMOS sensors, the electronics is distributed in each pixel, so that the electronics is irradiated by the electrons of the electron beam, making it susceptible to damage by irradiation. In both cases, these technologies are sensitive to damage by irradiation due to the high electron energies used in electron microscopes.

Another problem for these CMOS or CCD technologies is that the electrons are absorbed in different directions including the depth and width of the electron sensor. In this way, the effective resolution of the electron sensor is limited, i.e. the proximity wherein each "pixel" can be placed is delimited. This is due to the fact that if two adjacent "pixels" are too close to one another, when an electron impacts on a "pixel" it also generates a signal which can be appreciable in the adjacent "pixels". This effect is known as "charge sharing" or "cross-talk". In this way, in order for these "pixels" to be sufficiently separated and a good spatial resolution can be obtained in electron microscopes, the electron sensor has to be very big.

To avoid the first of these problems, i.e. the related to sensitivity to damage by irradiation, in TEM, indirect CMOS or CCD sensors are usually used. In these sensors, the electron does not directly impact on the semiconductor but on a scintillator, which is optically coupled to the sensor, and which, after the impact generates a cascade of photons, i.e. these electrons are converted into photons. These low-energy photons, within the visible spectrum, are those measured in the "pixelated" photon sensor. In contrast, this indirect detection of the electrons converted into photons does not solve the problem of "charge sharing" or "cross-talk" and degrades the sensor operation, affecting some of its technical characteristics such as detective quantum efficiency (DQE) and modulation transfer function (MTF). As a result of this, the quality of the images deteriorates, and it is necessary to increase the exposure time to form images with a suitable signal-noise ratio. This increase in exposure time is counter-productive for examining many types of sample, such as, for example, biological samples, which are highly susceptible to altering their atomic structure during the observation process in a TEM experiment.

Recently, with the aim of avoiding all these problems, CMOS sensors have been developed for their direct use, i.e. capable of measuring electrons without the need for photo-conversion in transmission electron microscopes. These new CMOS sensors are based on a combination of known techniques such as: the use of submicrometric manufacturing techniques, "radhard layout" and backlighting to improve the resistance of the electronic circuit part in the pixels to damages by irradiation and to increase the "fill factor". As well as substrate thinning technologies of the electron sensor to improve the sensor's spatial resolution, by reducing the problem of "charge sharing".

It also uses "Silicon-on-Insulator" technology that allows greater substrate thinning with respect to conventional CMOS technology.

In any of these cases, the electron sensor thinning process is complex, and makes the CMOS or CCD sensors very fragile. This also reduces the "manufacturing yield" and makes the process more expensive. Furthermore, despite the "radhard layout", these CMOS or CCD sensors are still susceptible to damage by irradiation when high-energy electron beams are used or with high current densities. Therefore, they are usually accompanied by additional protection systems in their application in TEM to control the irradiation dose.

More specifically, when CMOS or CCD sensors are used to capture images of diffraction patterns, which are usually formed by discrete points distributed in the image with a high electron current density, these sensors are even more susceptible of being damaged by irradiation.

Another type of direct sensors is of hybrid CMOS or CCD type, wherein to avoid damage by irradiation with electrons, they use a "pixelated" sensor which is separated from the electronic circuitry by means of the "bump-bonding" technique. In this case, the "fill factor", i.e. the ratio between the area with "pixels" of the sensor and its total area, is 100%. Furthermore, the electrons are completely absorbed in the electron sensor so that the electronic circuitry is not damaged by irradiation. Despite this, this hybrid technology is not a conventional technology, the number of pixels is limited due to its own manufacturing technology, and it has additionally "charge sharing" problems since the sensor cannot be thinned, which implies lower spatial resolution.

Finally, electron sensors made with SSD ("silicon strip detectors") technology have also been proposed, wherein the surface of the electron sensor, perpendicular to the beam of electrons which impacts it, contains a plurality of electrodes extended by way of parallel silicon bands and separated from one another forming one or two layers. In this type of electron sensors, the electrons may directly impact the sensor.

In contrast, this type of SSD sensor reduces the "fill factor" of the electron sensor and its substrate must be thinned below 50 µm to have a suitable spatial resolution for electron microscopes. Furthermore, they are not manufactured with conventional technologies. All of this entails an expensive and complex process, which makes the sensor very delicate as it can be broken easier, reducing the manufacturing yield.

A final problem relates to the dynamic range of "pixelated" electron sensors, i.e. the amplitude of the range of intensity values that can be measured in each pixel. In the sensors that receive the electrons directly, it is possible to obtain an infinite dynamic range, counting the number of electrons which impact on each "pixel" in a time interval. But this is not practical when the intensities in a "pixel" are very high since the electronics is not capable of processing the successive impacts with sufficient speed.

In said situations, it is necessary to operate the detectors in integrator mode, i.e. it measures in each pixel the sum of the charge generated by a large number of impacts and not each individual impact. That value measured in integrator mode is an analogue value that it is necessary to digitize, with a dynamic range determined by the number of bits of the analogue-digital converter used. In current "pixelated" detectors, each pixel only has a digital-analogue converter with a typical dynamic range of 12 bits. This range is insufficient in TEM when two-dimensional images of diffraction patterns are taken. As a result, the intensities go out of the dynamic range in some of the image's pixels and their real value is not captured.

DESCRIPTION OF THE INVENTION

The present invention discloses an electron sensor for electron microscopy using an electron microscope, wherein the electron sensor comprises a substrate, with a front plane and a rear plane parallel to one another, which is intended to absorb at least one electron of an electron beam, which traverses a sample and is generated by the electron microscope, and this electron is susceptible of generating an electric charge of free electron-hole (e-h) pairs in said substrate.

More specifically, the electron sensor comprises:
a lateral reception surface, placed on one of the sides of the substrate to perpendicularly receive the electron beam,
a guard unit, with a lower plane and an upper plane, placed on the front plane parallelly bordering at least the lateral reception surface traversed by the electron beam, to avoid leakage currents in the edge of the substrate,
a base unit, with a lower plane and an upper plane, placed on the front plane after the guard unit, intended to measure the energy of the electrons which impact on the lateral reception surface,
an input unit, with a lower plane and an upper plane, placed on the front plane between the lower plane of the guard unit and the upper plane of the base unit to detect the input point of the electrons of the electron beam,
a contact unit, placed on the rear plane, and
an electronic circuit unit, placed after the base unit and linked to at least the base unit, the contact unit and the input unit, which comprises an electric generator and electric circuit.

Wherein, said electric generator generates an electric polarization current, between the front plane and the rear plane, which pulls the free electrons generated in the substrate towards the base unit and/or the input unit, and pulls the free holes generated in the substrate towards the contact unit; allowing the electrons and the holes to be captured by their respective units and conditioning and processing the free electrons, using an electronic circuit comprised in said contact unit, to form a one-dimensional or two-dimensional image with greater dynamic range and to measure the energy of the electrons that form the image.

More specifically, the input unit comprises a series of input electrodes, or "pixels", separated from one another, and the lower plane of the guard unit comprises at least one guard electrode with a plurality of notches (15) suitable for housing the upper plane of the series of input electrodes without directly contacting with them.

More specifically, the base unit is intended to reduce the "cross-talk" between adjacent input electrodes, and measure the energy of the electrons which impact on the substrate.

Additionally, the upper plane of the base unit comprises a base electrode with a plurality of notches suitable for housing the lower plane of the series of input electrodes without directly contacting with them.

Preferably, the joining area between the lower plane of the input unit and the upper plane of the base unit comprises an energy measurement unit to increase the precision of energy measurement of the electrons which traverse the input unit series.

Said energy measurement unit comprises a series of energy measurement electrodes.

Preferably, each energy measurement electrode comprises a superposition of measurement electrodes of appreciably oval configuration.

It should be highlighted that the input unit, the contact unit and the base unit are connected to an electronic circuit unit by means of tracks placed on the substrate of contacts with high electrical conductivity, e.g. gold or polysilicon.

Alternatively, the input unit, the contact unit, the energy measurement unit and the base unit are connected to an electronic circuit unit by means of tracks placed on the substrate of a contact with high electrical conductivity, e.g. aluminium, gold or polysilicon.

More specifically, the base electrode, each input electrode and each electrode of the superposition of energy measurement electrodes are connected, by means of tracks placed on the substrate of a contact with high electrical conductivity, e.g. aluminium, gold or polysilicon.

Said electronic circuit unit is distanced from the base unit to avoid exposure to the radiation of the electrons and to the secondary radiation generated in the substrate.

Said electronic circuit unit allows measuring the impact position and the energy of the electrons in at least two different ways.

The circuit unit can measure in position count mode, where it counts how many electrons impact on each input electrode, in this way it is possible to know in what part of the lateral reception surface the electrons impact and the number of impacts. Additionally, the circuit unit can measure in position integrator mode, where it adds up the total charge released by the electrons which impact on each input electrode during a determined time and knowing on what part of the lateral reception surface they have impacted. In both cases, the electric charge generated in the sensor and which is not captured by the input electrode (point of impact of the electron) is captured by the energy measurement electrodes and/or by the base electrode. In this way, the "cross-talk" is reduced between the neighbouring input electrodes in the linear direction of the sensor.

Additionally, the circuit unit can measure in count and integrator mode, wherein it measures the number of electrons that impact on each input electrode knowing on what part of the lateral reception surface, whilst it integrates, i.e. adds up the total charge released by the electrons which impact on each energy measurement electrode during a determined time.

Alternatively, the circuit unit can measure in double integrator mode, wherein it adds up the total charge released by the electrons which impact on each input electrode and on each energy measurement electrode during a determined time, knowing on what part of the lateral reception surface the impact occurs.

Preferably, the electrodes of all the units of the front and rear planes of the substrate are made with doping materials diffused in the substrate. More specifically, the diffusions of p-type or n-type dopants of the rear and front faces of the substrate, respectively, and the doping of the substrate constitute an "array" of diodes with p-n bonds.

By this way, a polarization voltage is applied, by means of said circuit unit, between the electrodes of the rear and front faces of the substrate, so that the "diodes" are inverse polarized creating a depletion area in the substrate.

It should be highlighted that the electron sensor proposed is preferably a linear sensor, i.e. it is formed by a single line, or electrode vector, to measure a one-dimensional or two-dimensional image, and it allows measuring the energy of the electrons impacting each pixel of the image.

Preferably, this electron sensor can be manufactured with conventional lithographic techniques and the electronic circuitry by means of CMOS microelectronic technology. More specifically, it can be manufactured by means of standard CMOS technology, so that whilst in one area of the substrate the electronic circuit unit is manufactured, at the other end only the units that comprise the different electrodes are manufactured.

Additionally, this electron sensor allows its use as direct "pixelated" detector of the energy filters that are used in electron energy loss spectrometry applications (EELS or EFTEM). In the case of EELS, the sensor measures the one-dimensional energy spectrum dispersed by the energy filter. In the case of EFTEM, the sensor is used to form two-dimensional images in a specific energy range.

Additionally, by placing each sensor pixel of various electrodes at different depths (input electrode and energy measurement electrodes) to measure the charge generated by the impact of an electron, it is possible to measure the energy of the impacting electron without the need to use an energy filter.

In this way, an electron sensor is obtained that is resistant to damage by irradiation, which can directly measure the electrons which impact it with high spatial and energy resolution.

Likewise, by placing in each pixel not just one but several electrodes at different depths (input electrode and energy measurement electrodes), it is possible to measure the charge generated by the impact of the electrons in a determined time (integrator mode) using more than one electrode in each and, thus, obtaining a greater dynamic range of the sensor compared with the existing pixelated sensors.

Another advantage of this electron sensor is that it allows forming said two-dimensional images in a TEM microscope, scanning the electron beam by electromagnetic means and capturing the image line by line. This is a difference with respect to the sensor technologies used in image formation applications with optical photons, or X-rays, which are particles without electric charge and, therefore, they cannot be scanned by scanning the beam by electromagnetic means.

Additionally, as said electron sensor is formed by a single line of input electrodes, the problem of "charge sharing" is eliminated in the transversal direction of the sensor.

Furthermore, due to the fact that the lateral reception surface does not contain electrodes, the "fill factor" of the electron sensor design proposed here is 100%. This enables detecting impacts of electrons between two input electrodes, using for this averaged signal techniques between adjacent input electrodes, known as subpixel techniques, and, in this way, increase the effective resolution of the sensor.

By way of summary, this electron sensor is easy to manufacture and allows generating one-dimensional or two-dimensional images with greater image range, as well as, measuring the electron energy with electrodes at different depths of the substrate, without the electronics for control and processing of the sensor signals being exposed to the irradiation of the electron beam.

DESCRIPTION OF THE DRAWINGS

To complement the description being made and in order to aid towards a better understanding of the characteristics of the invention, in accordance with a preferred example of practical embodiment thereof, a set of drawings is attached as an integral part of said description wherein, with illustrative and non-limiting character, the following has been represented.

PREFERRED EMBODIMENT OF THE INVENTION

Figure 1:
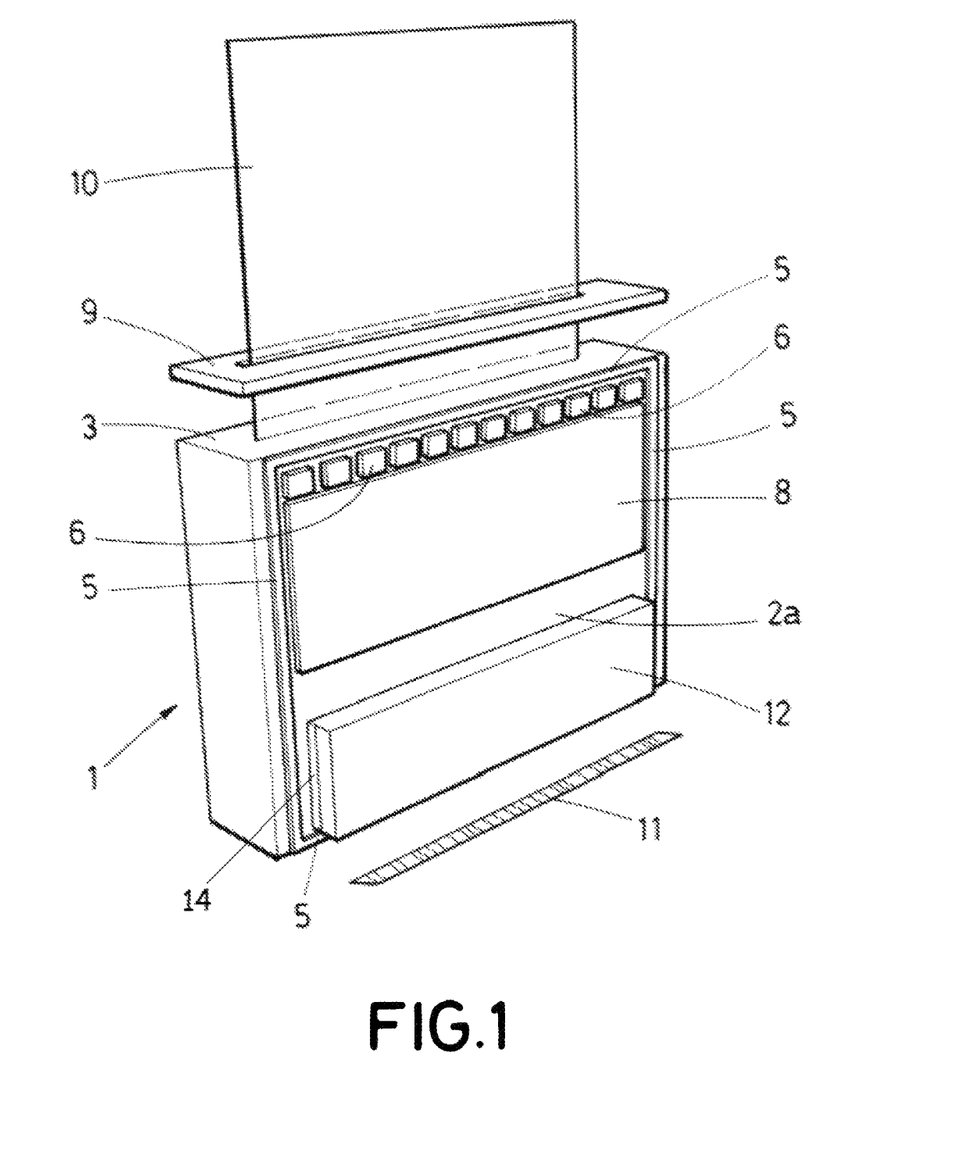
FIG. 1.—Shows a perspective view of a preferred embodiment of the electron sensor.
Figure 2:
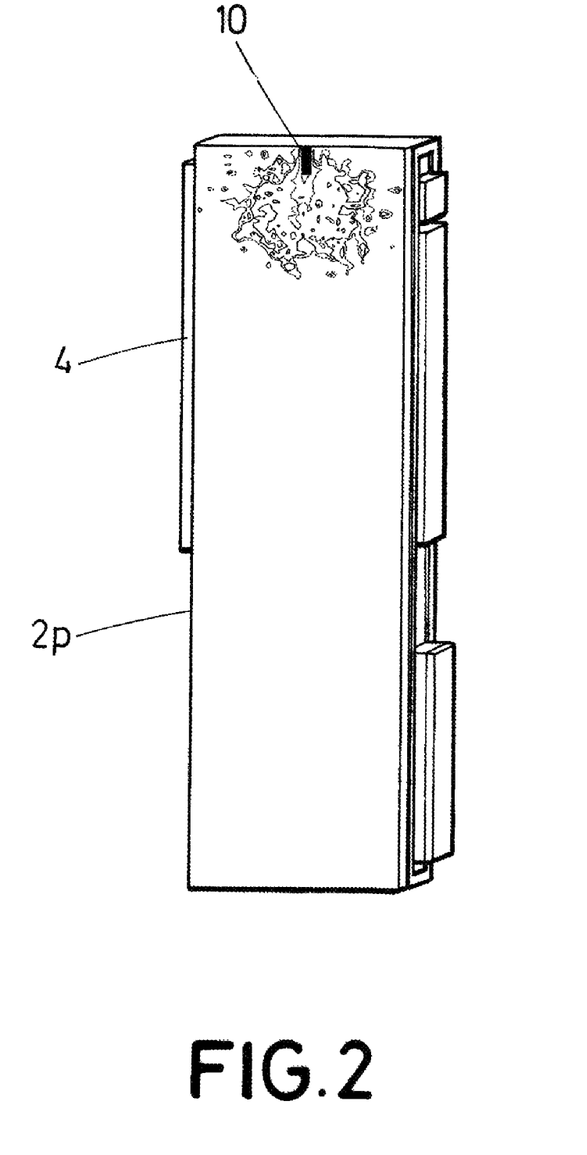
FIG. 2.—Shows a side schematic view of the preferred embodiment of the electron sensor.

In a preferred embodiment of the invention, as shown in FIGS. 1 and 2, the electron sensor (1), for TEM electron microscopy, comprises a silicon substrate (2) that perpendicularly receives, by means of a lateral reception surface (3), an electron beam (10) that has come from traversing a sample, not represented, to investigate. Wherein said electron beam (10) is produced by the TEM microscope, and comprises at least one electron with an electric charge and an energy. To form an image (11), the impact position and/or energy of a large number of electrons of the electron beam (10) are measured.

The substrate (2) comprises a rear plane (2p) and a front plane (2a) parallel to one another, and perpendicular to the lateral reception surface (3). A contact unit is placed on said rear plane (2p), and on its front plane (2a) the following are placed on, by order of shortest to longest distance to the lateral reception surface (3): a guard unit, an input unit, an energy measurement unit, a base unit and an electronic circuit unit (12).

Preferably, the substrate (2) has a thickness between 300 and 600 µm, and is made of slightly doped p-type silicon with resistivity between 2 and 10 kn.

When this electron beam (10) impacts on the lateral reception surface (3), the electrons of the electron beam (10) are losing energy by means of the generation of a free charge of electron-hole (e-h) pairs in the silicon of the substrate (2). The generation of an electron-hole pair in silicon requires 3.6 eV so that a single electron of 100 keV that impacts on the lateral reception surface (3) generates approximately 27,777 e-h pairs. It should be highlighted that when the electron impacts on the lateral reception surface (3), it describes a random trajectory and loses energy as it generates a free charge of e-h pairs. This electron is finally totally absorbed by the substrate (2) at a distance, which may be hundreds of micrometres, from the lateral reception surface (3) i.e. from the point of impact. Therefore, each electron that impacts is absorbed at some point of an area typically called interaction volume. This interaction volume usually has the form of a pear, as is schematically shown in FIG. 2 and in FIG. 3b, and its size depends on the initial energy of the electron.

More specifically, before impacting on the lateral reception surface (3) said electron beam (10) traverses a mask (9) opaque to the electrons, preferably manufactured in platinum, with a notch (15) which extends throughout the width of the electron sensor (1). More specifically this notch (15) has a width equal to the pitch between "pixels" of the input unit, and preferably it is close to the lateral reception surface (3). In this way, the mask (9) defines the effective width of the "pixel" in the direction of the thickness of the substrate (2).

Figure 3A:
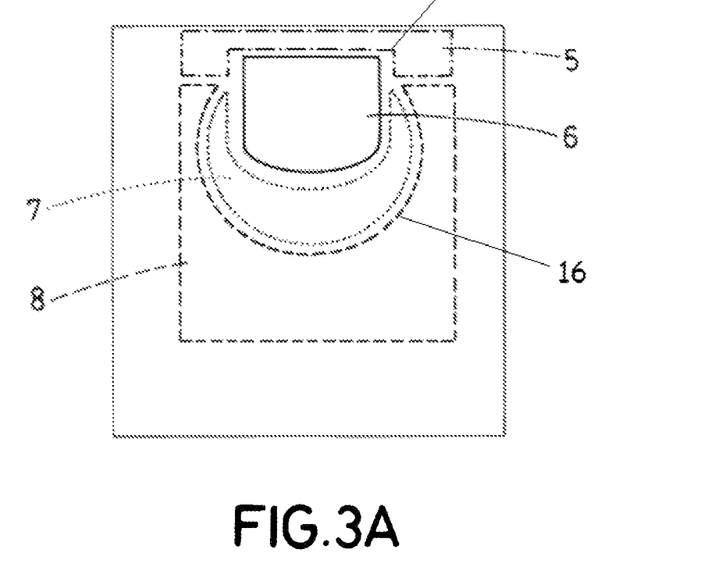
FIG. 3a.—Shows a detailed schematic view of the position of the electrodes.

Preferably, as shown in FIGS. 1, 2 and 3a, the contact unit which comprises a contact electrode (4) substantially occupies the entire width of the rear plane (2p) and has a maximum height of 400 µm. Said contact electrode (4) is a deposition of doped p+-type silicon intended to capture the free holes generated in the substrate (2) by the impact of said electron of the electron beam (10) and which are pulled by an electric polarization field towards the rear plane (2p).

Preferably, the guard unit comprises a guard electrode (5). The guard electrode (5) is placed so that it extends along the width and length of the substrate (2), bordering the entire front plane (2a). Its geometry is substantially an array of strips as four strips that form a frame, wherein the side closest to the lateral reception surface (3) has a plurality of notches (15). Said guard electrode (5) is a deposition of doped n-type silicon with a height of 2 µm intended to capture the free electrons generated in the substrate (2) by the impact of said electron of the electron beam (10) and which are pulled by the electric polarization field towards the front plane (2a).

The input unit comprises a series of input electrodes (6) preferably of rectangular configuration and separated from one another, to capture the specific point of impact of the electrons of the electron beam (10) on the lateral reception surface (3). Said input electrodes (6) are depositions of doped n-type silicon intended to capture the free electrons generated in the substrate (2) by the impact of said electron of the electron beam (10) and which are pulled by the electric polarization field towards the front plane (2a).

Specifically, the input electrodes (6) have an appreciably rectangular configuration with a height of 10 to 70 µm and a width of 4 to 20 µm. More specifically, their upper plane is housed in said plurality of notches (15) of the guard electrode (5). Each one of these input electrodes (6) are separated from the adjacent one by a distance of 10 to 50 µm. It should be highlighted that each notch (15) of the guard electrode (5) has a height of at least 1 µm and a width of at least 6 µm, wherein said width is always at least 1 µm greater than the width of the input electrode (6) that it houses, so that they are never in direct contact, as can be seen in FIG. 3a.

Furthermore, the number of input electrodes (6) determines the spatial resolution of the electron sensor (1). In this way, in this preferred embodiment, the number of input electrodes (6) or "pixels" is equal to 2048, the width of each input electrode (6) is 10 µm and the height is 50 µm, and the separation between each central vertical axis of each input electrode (6) is 25 µm. Therefore, the width of the electron sensor (1) is at least 51,200 µm. It should be highlighted that these 2048 input electrodes (6) have not been totally represented in figures to facilitate their understanding.

Preferably, the lower plane of each one of the input electrodes (6) are housed in a plurality of receptacles (16) of the base unit. In other words, the base unit comprises a base electrode (8) with said plurality of receptacles (16) that partially cover each one of the input electrodes (6).

More specifically, this base electrode (8) extends along the width of the front plane (2a) and has a height between 100 and 400 µm. It should be highlighted that the size of these receptacles (16) is variable, but they preferably have an appreciably oval configuration with a height between 10 and 150 µm, and a width between 10 and 35 µm. Preferably, the base electrode (8) comprises a height of 200 µm, and each receptacle (16) has a height of 50 µm and a width of 20 µm. Said base electrode (8) is a deposition of doped n-type silicon intended to capture the free electrons generated in the substrate (2) by the impact of said electron of the electron beam (10) and which are pulled by the electric polarization field towards the front plane (2a).

It should be highlighted that for each input electrode (6) the guard electrode (5) has a notch, and the base electrode (8) has a receptacle (16).

In this preferred embodiment, as is shown in greater detail in FIG. 3a, in the joining area between each input electrode (6) and the base electrode (8), i.e. the area between the lower plane of the input electrodes (6) and the upper plane of the base electrode (8), the electron sensor (1) comprises the energy measurement unit. This energy measurement unit, in turn, comprises an energy measurement electrode (7) for each input electrode (6). These energy measurement electrodes (7) increase the precision of the energy measurement of the electrons which traverse the series of input electrodes (6). Specifically, these energy measurement electrodes (7) are surrounded by the base electrode (8) and have appreciably oval shape with a height between 10 and 20 µm, and a width between 20 and 30 µm. Preferably, each energy measurement electrode (7) comprises a height of 20 µm and a width of 20 µm. Said energy measurement electrodes (7)

are depositions of doped n-type silicon intended to capture the free electrons generated in the substrate (2) by the impact of said electron of the electron beam (10) and which are pulled by the electric polarization field towards the front plane (2a). In this way, as is shown in FIG. 3b, it increases the precision of the electron sensor to measure the charge (and therefore the energy) generated in the substrate by the impacting electrons (1).

Figure 3B:
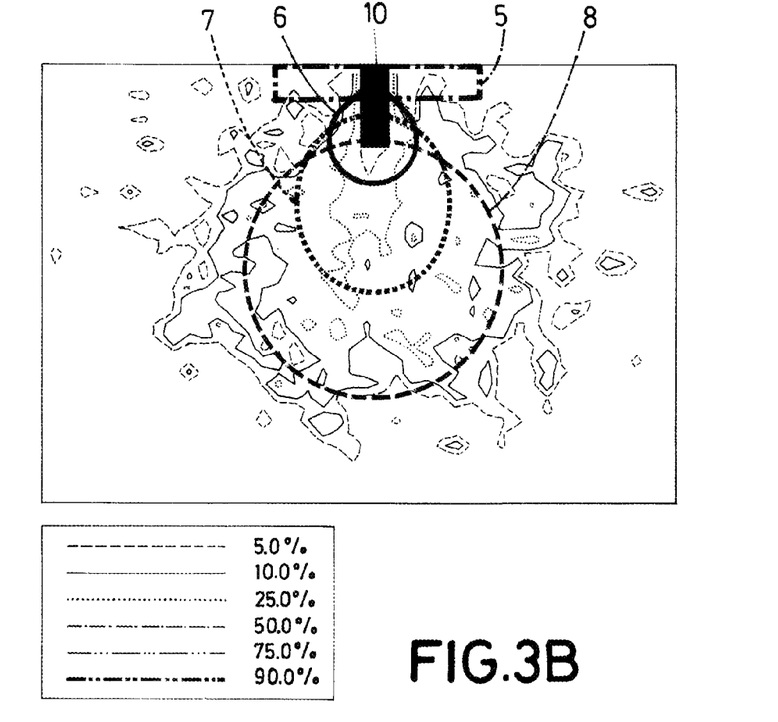
FIG. 3b.—Shows a detailed schematic view of the position of the electrodes wherein an electron beam impacts on the lateral reception surface.

More specifically, FIG. 3b shows the probability that the electrons of the electron beam (10) are absorbed at different depths in the substrate (2). Additionally, this FIG. 3b shows by which electrode or electrodes (6, 7, 8) the charge generated by the electron throughout its trajectory through the substrate (2) shall be detected. In this way, it can be verified how the electron sensor (1) detects with great precision where the electrons impact by means of the input electrode (6). Additionally, this electron sensor (1) enables measuring the energy of the electron of the electron beam (10) detecting the free charge of e-h pairs generated at different depths, by means of the electrodes (6, 8), (7, 8) or (6,7,8). These electrodes (6, 7, 8) detect the depth and lateral distribution at which the electrons are absorbed in the substrate (2), with both the depth and lateral distribution proportional to the initial energy of the electrons.

It should be highlighted that the distance between each electrode (5, 6, 7, 8) of the front plane (2a) is between 1 and 2 μm. More specifically, these separation areas are found in the following electrodes (5, 6, 7, 8):

between each notch (15) of the guard electrode (5) and each input electrode (6),
between each guard electrode (5) and the base electrode (8),
between each input electrode (6) and each receptacle (16) of the base electrode (8),
between each input electrode (6) and each energy measurement electrode (7),
between each energy measurement electrode (7) and each receptacle (16) of the base electrode (8).

Figure 4:
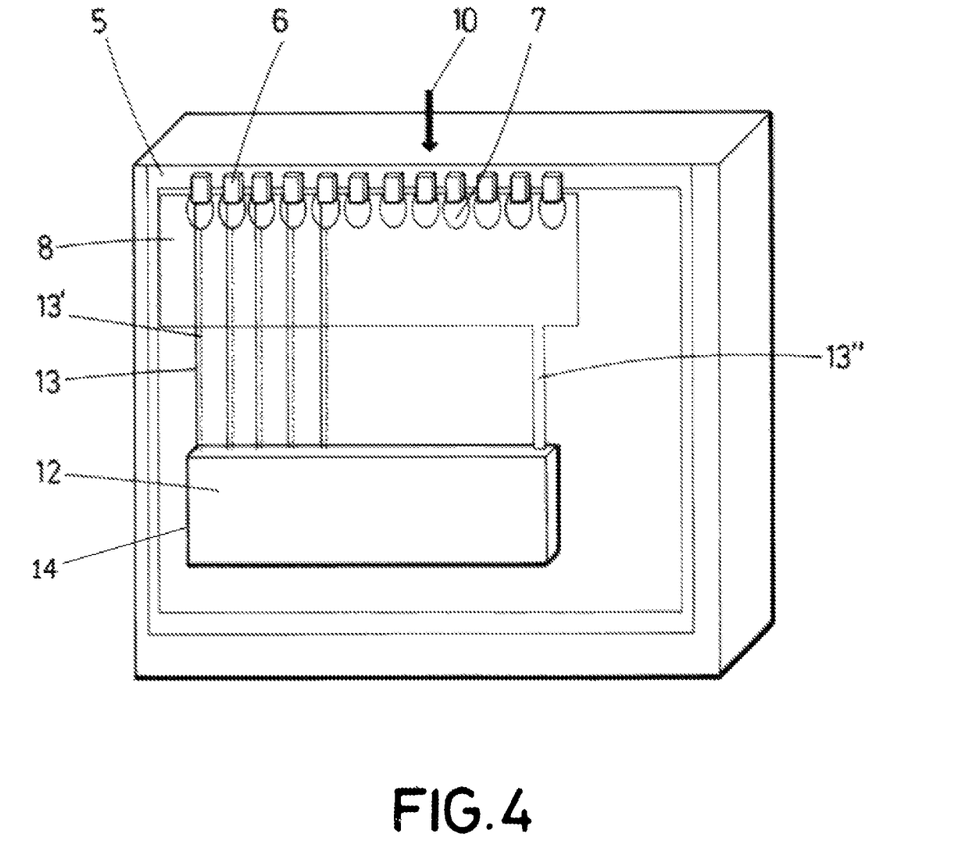
FIG. 4.—Shows a detailed schematic view of the connections of the electrodes.

Additionally, the base electrode (8), each input electrode (6) and each energy measurement electrode (7) are connected, by means of metal tracks (13, 13', 13") generally of aluminium placed on the substrate (2), to an electronic circuit unit (12) inserted in the front plane (2a) of the substrate (2) after the base electrode (8), as is schematically shown in FIG. 4. Additionally, contact electrode (4) is also connected to the electronic circuit unit (12) by means of a metal track, not represented.

Said electronic circuit unit (12) comprises an electric generator (14) to generate a polarization voltage between the electrodes (5, 6, 7, 8) of the front plane (2a) and the contact electrode (4) of the rear plane (2p). Specifically, the electrodes (5, 6, 7, 8) are at a negative polarization potential with respect to the contact electrode (4). In this way, the polarization voltage generates an electric field which serves to pull the holes or the free electrons of the e-h pairs generated in the substrate (2) towards the rear plane (2p) or towards the front plane (2a).

More specifically, the free electrons of the e-h pairs generated by the impact of an electron are pulled towards the electrodes (5,6, 7, 8) of the front plane (2a) and the holes are pulled towards the only contact electrode (4) of the rear plane (2p) of the electron sensor (1). This movement of charges induces an electric current in the electrodes (4, 5, 6, 7, 8) which, through metal tracks (13, 13', 13") placed on the substrate (2), is measured in the electronic circuit unit (12).

More specifically, the electronic circuit unit (12) comprises at least one electronic circuit to condition and process the information captured by the electrodes (5, 6, 7, 8) by the impact of at least one electron of the electron beam (10) received on the lateral reception surface (3).

Preferably, several electron sensors (1) are placed in parallel with different configurations to obtain different advantages, and to generate two-dimensional images formed by the successive addition of one-dimensional lines measured by each one of the electron sensors (1).

Figure 5A:
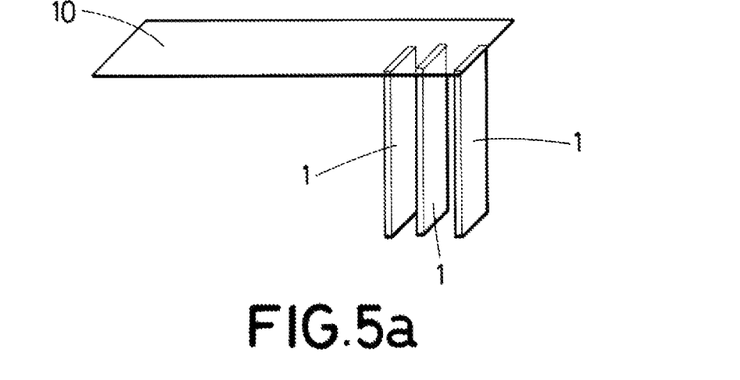
FIG. 5a.—Shows a schematic view of a first configuration of several electron sensors placed in parallel.

The first configuration of several electron sensors (1) in parallel, is shown in FIG. 5a, wherein three electron sensors (1) are linked, distanced from one another. Each one of these electron sensors (1) has dimensions of the electrodes (4, 5, 6, 7, 8) optimized to detect a range of initial energies of the electrons of the electron beam (10). In this case, preferably for TEM microscopes, each one of the electron sensors (1) is configured to detect, respectively, the following electron energy ranges: 60-120 keV, 120-200 keV and 200-300 kV. In this way, depending on the energy used in a specific application, it is possible to select the use of a single electron sensor (1) to form the image (11).

Figure 5B:
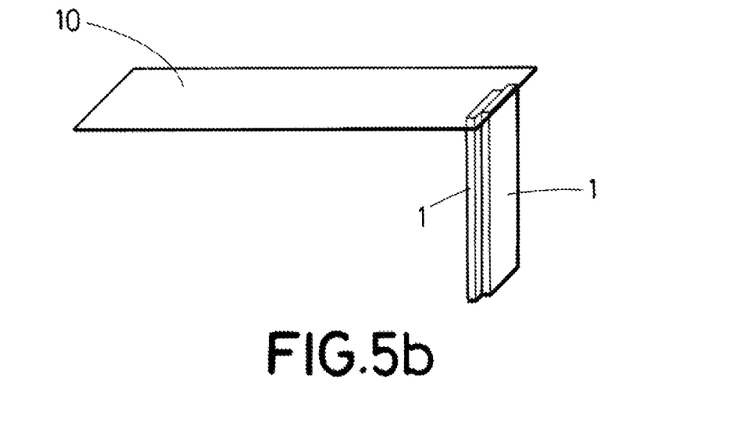
FIG. 5b.—Shows a schematic view of a second configuration of several electron sensors placed in parallel.

The second configuration of several electron sensors (1) in parallel, is shown in FIG. 5b, wherein two electron sensors (1) are positioned, displaced from one another at a distance of half a pixel to duplicate the spatial resolution. In this case, both electron sensors (1) are used at the same time.

Figure 5C:
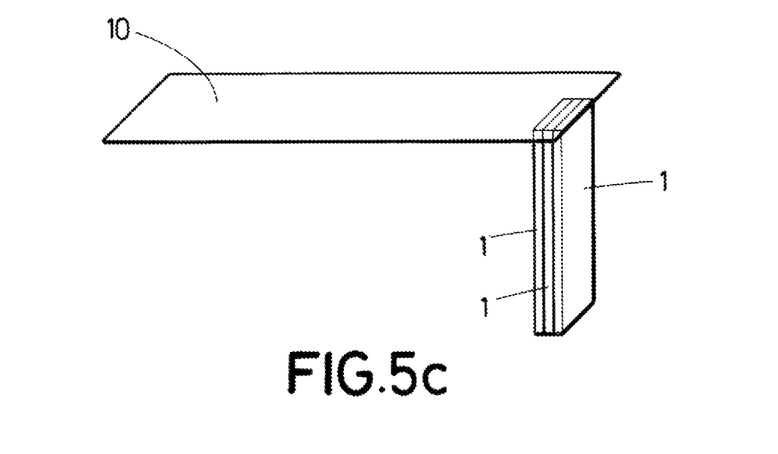
FIG. 5c.—Shows a schematic view of a third configuration of several electron sensors placed in parallel.

The third configuration of several electron sensors (1) in parallel, is shown in FIG. 5c, wherein at least two electron sensors (1), although preferably three, are placed in parallel. In this way, it is possible to acquire images at a greater speed, i.e. more frames per second, without reducing the exposure time by means of the "Time-Delay-Integration" technique which is applied with linear sensors in optical applications. This configuration is especially useful in applications which require the capture of series of two-dimensional images at high speed such as, for example, in dynamic applications with TEM microscopes (in-situ TEM).

Figure 5D:
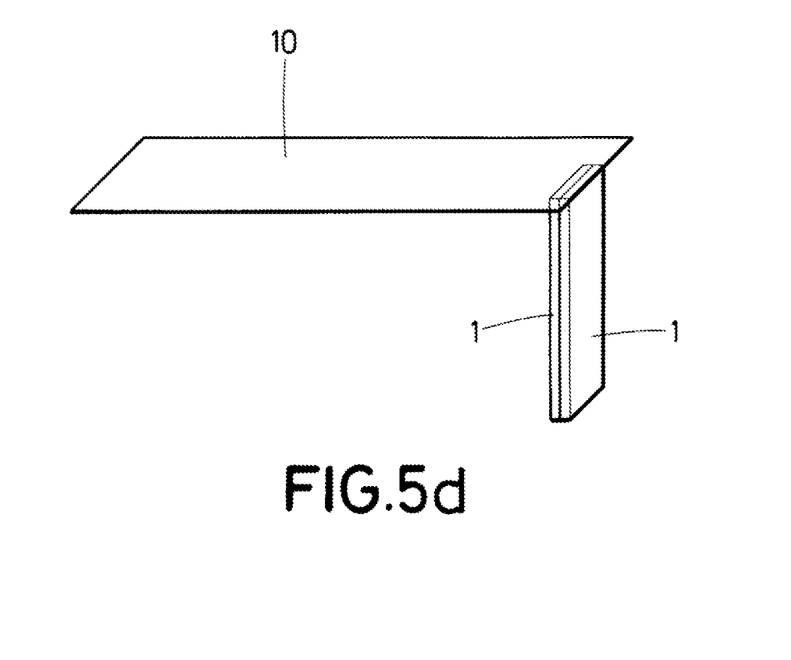
FIG. 5d.—Shows a schematic view of a fourth configuration of several electron sensors placed in parallel.

The fourth configuration of several electron sensors (1) in parallel, is shown in FIG. 5d, wherein at least two electron sensors (1) are placed in parallel and each one of them comprises input electrodes (6) and/or energy measurement electrodes (7) with different sizes. This configuration allows forming the image (11) with different resolutions.

Figure 5E:
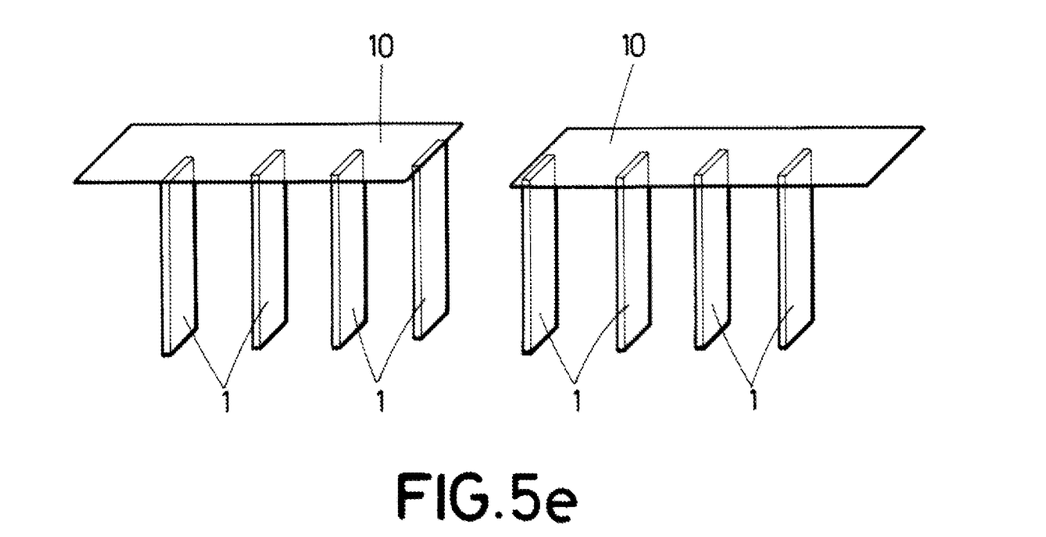
FIG. 5e.—Shows a schematic view of a fifth configuration of several electron sensors placed in parallel.

The fifth configuration of several electron sensors (1) in parallel, is shown in FIG. 5e, wherein they are connected to a plurality of electron sensors (1) to form a two-dimensional image (11) scanning the electron beam (10) successively in discrete steps and capturing a line of pixels in each position with each electron sensor (1). In other words, to form a two-dimensional image (11) of 2048×2048 pixels and if the electron sensor (1) comprises a line of 2048 input electrodes (6), it would have to measure 2048 lines in 2048 discrete positions. The process is more efficient, placing preferably 3 electron sensors (1) with a separation of 512 pixels. In this way, the electron beam (10) would be scanned at an equivalent distance of 512 pixels instead of 2048 pixels, and the capture of the two-dimensional image (11) would be performed in a quarter of the time.

It should be highlighted that the present electron sensor (1) is susceptible of measuring a one-dimensional or two-dimensional image.

Preferably, to measure one-dimensional images, typically when it is used in combination with an energy filter, both the electron sensor (1) and the electron beam (10), which is projected from the electron microscope, are maintained in the same horizontal position.

Whilst at least four methods are used to measure two-dimensional images. In any of these methods, the two-dimensional image (11) is formed by means of the capture of multiple projection lines of the electron beam (10) with the electron sensor (1).

Preferably, in the first method, the electron sensor (1) is fixed in a position in the projection plane of the electron beam (10), and the representation projected by the TEM is scanned by means of electromagnetic systems (e.g. coils of the projection lens included in any TEM), which is displaced in a direction perpendicular to the linear direction of the sensor.

Preferably, in the second method, the projection of the electron beam (10) is in a fixed position, and the electron sensor (1) is displaced by mechanical means such as the use of an electric motor with a mechanical system that transforms the rotation of the motor in linear displacement. The advantage of this method is that it is not necessary to control the TEM's electromagnetic systems for the beam scanning.

Preferably, in the third method, the projection of the electron beam (10) and the electron sensor (1) is in a fixed position, and the sample is displaced by mechanical means such as the use of an electric motor with a mechanical system that transforms the rotation of the motor in linear displacement. The advantage of this method is that it is not necessary to control the TEM's electromagnetic systems for the beam scanning.

Preferably, in the fourth method, when the sensor is used as sensor in EFTEM applications, the projection of the electron beam (10) filtered by an energy filter, the electron sensor (1) and the sample, are in a fixed position, and the energy-filtered electron beam is scanned in the perpendicular direction of the electron sensor (1) using the electromagnetic systems present in the energy filters that are commonly used in TEM for spectrometry applications.

In another preferred embodiment, not represented, the electron sensor (1) is also applicable for measuring the energy of transmitted and secondary electrons in scanning electron microscopes in transmission mode, called STEM and SEM, by means of the scaling of the size of the electron sensor (1) and the number and the geometry of the pixels or electrodes (4, 5, 6, 7 8), to adapt it to these applications and the particular energy ranges of the application.

More specifically, in SEM and STEM applications, the images of the electron sensor (1) that we propose would be fixed in one position of the microscope, since the images and spectrums in these applications are formed by scanning a beam from point to point.

The invention claimed is:

1. An electron sensor for electron microscopy using an electron microscope, wherein the electron sensor comprises a substrate, with a front plane and a rear plane parallel to one another, which is intended to absorb at least one electron of an electron beam, which traverses a sample and is generated by the electron microscope, and the at least one electron is susceptible of generating an electric charge of free electron-hole (e-h) pairs in said substrate, characterized in that the electron sensor also comprises:
   a lateral reception surface, placed on one side of the substrate to perpendicularly receive the electron beam,
   a guard unit, with a lower plane and an upper plane, placed on the front plane, parallelly bordering at least the lateral reception surface traversed by the electron beam, to avoid leakage currents in the edge of the substrate,
   a base unit, with a lower plane and an upper plane, placed on the front plane after the guard unit, intended to measure the energy of the electrons of the electron beam which impact on the lateral reception surface,
   an input unit, with a lower plane and an upper plane, placed on the front plane between the lower plane of the guard unit and the upper plane of the base unit, to detect an input point of the electrons of the electron beam,
   a contact unit, placed on the rear plane, and
   an electronic circuit unit, placed after the base unit and linked to at least the base unit, the contact unit and the input unit, which comprises an electric generator and electric circuit,
   wherein said electric generator generates an electric polarization current, between the front plane and the rear plane, which pulls the free electrons generated in the substrate towards the base unit and/or the input unit, and pulls the free holes towards the contact unit; allowing the electrons to be captured by the base unit and/or input unit and the holes to be captured by the contact unit and processing the free electrons, using an electronic circuit comprised in the contact unit, to form a one-dimensional or two-dimensional image with greater dynamic range.

2. The electron sensor of claim 1, wherein the input unit comprises a series of input electrodes.

3. The electron sensor of claim 2, wherein the input electrodes comprise a height between 10 and 70 µm, a width between 4 and 20 µm, and wherein said input electrodes are separated from one another at a distance between their vertical axes between 10 and 50 µm.

4. The electron sensor of claim 3, wherein the input electrodes comprise a height of 50 µm, a width of 10 µm, and are separated from one another at a distance between their vertical axes of 25 µm.

5. The electron sensor of claim 2, wherein the guard unit comprises at least one guard electrode close to the lateral reception surface, and on the lower plane of the guard unit there is a plurality of notches to house the upper plane of the input electrodes without directly contacting.

6. The electron sensor of claim 5, wherein the guard electrode is placed as four strips that form a frame, two of them along the width and two along the length of the substrate wherein the strip of the guard electrode closest to the lateral reception surface has a plurality of notches to house the upper plane of the input electrodes without directly contacting.

7. The electron sensor of claim 5, wherein the guard electrode comprises a height of 2 µm, and each notch has a height of at least 1 µm and a width at least 1 µm greater than that of the width of the input electrode.

8. The electron sensor of claim 2, wherein the base unit comprises a base electrode with a plurality of receptacles in its upper plane to house the lower plane of the input electrodes without directly contacting.

9. The electron sensor of claim 8, wherein the base electrode extends along the width of the substrate and has a height between 100 and 400 µm.

10. The electron sensor of claim 9, wherein the base electrode comprises a height of 200 µm.

11. The electron sensor of claim 8, wherein each receptacle of the base electrode has an appreciably oval configuration with a height between 10 and 150 µm, and a width between 10 and 35 µm.

12. The electron sensor of claim 8, wherein each receptacle of the base electrode comprises a height of 50 µm and a width of 20 µm.

13. The electron sensor of claim 8, wherein the joining area between the lower plane of the input electrodes and the upper plane of the base electrode comprises a series of energy measurement electrodes to measure the energy of the electrons which, on impacting on the lateral reception surface, traverse the input electrodes.

14. The electron sensor of claim 13, wherein the energy measurement electrodes have an appreciably oval shape with a height between 10 and 20 µm, and a width between 20 and 30 µm.

15. The electron sensor of claim 14, wherein the energy measurement electrodes comprise a height of 20 µm and a width of 20 µm.

16. The electron sensor of claim 15, wherein each energy measurement electrode comprises a superposition of measurement electrodes of appreciably oval configuration.

17. The electron sensor of claim 16, wherein the contact unit comprises a contact electrode and wherein the contact electrode, the base electrode, each input electrode and each electrode of the superposition of energy measurement electrodes are connected, by means of metal tracks placed on the substrate, to the electronic circuit unit, which is inserted in the front plane of the substrate after the base electrode.

18. The electron sensor of claim 13, wherein the contact unit comprises a contact electrode and wherein the contact electrode, base electrode, each input electrode and each energy measurement electrode are connected, by means of metal tracks placed on the substrate, to the electronic circuit unit, which is inserted in the front plane of the substrate after the base electrode.

19. The electron sensor of claim 1, wherein the contact unit comprises a contact electrode which substantially occupies the entire width of the rear plane and has a maximum height of 400 µm.

20. A system for electron microscopy using an electron microscope, wherein the system comprises at least two electron sensors according to claim 1, placed in parallel to generate two-dimensional images formed by the successive addition of one-dimensional lines measured by each one of the electron sensors.

* * * * *